United States Patent [19]

Haine

[11] Patent Number: 4,745,371
[45] Date of Patent: May 17, 1988

[54] PHASE-LOCKED DIGITAL SYNTHESIZER

[75] Inventor: John L. Haine, Cambridge, England

[73] Assignee: Libera Developments Limited, London, England

[21] Appl. No.: 888,798

[22] Filed: Jul. 23, 1986

[30] Foreign Application Priority Data

Aug. 2, 1985 [GB] United Kingdom ............... 8519521
Jun. 7, 1986 [GB] United Kingdom ............... 8613920

[51] Int. Cl.$^4$ .............................................. H03B 7/00
[52] U.S. Cl. .................................. 331/1 A; 331/17; 331/25
[58] Field of Search ............... 331/1 A, 10, 17, 25

[56] References Cited

U.S. PATENT DOCUMENTS 3,729,688  4/1973  Cerny, Jr. et al. ............... 331/17 X
4,629,999  12/1986  Hatch et al. ..................... 331/17 X Primary Examiner—Eugene R. LaRoche
Assistant Examiner—Robert J. Pascal
Attorney, Agent, or Firm—Oldham, Oldham & Weber Co.

[57] ABSTRACT

A phase-locked digital synthesizer comprises a voltage-controlled oscillator (6) supplying a frequency divider (7) the output of which is fed to a phase-sensitive detector (9) also receiving an input from a reference oscillator (10). The output of the detector (9) is fed back by a feedback loop to the voltage-controlled oscillator (6) to achieve phase-locking. The divider (7) receives an input from a logic circuit (8) to control the division ratio of the divider (7), the logic circuit being prompted by a control signal which is also used to select one of a plurality of loop filters (12,13) connected for selectable use in the feedback loop from the detector (9) to the voltage controlled oscillator (6), the selected loop filter being appropriate to the prompted division ratio. Other embodiments include compensating means to correct a loop phase error arising from a change in the division ratio.

8 Claims, 6 Drawing Sheets

PHASE-LOCKED DIGITAL SYNTHESIZER

DESCRIPTION

Field of the Invention

This invention relates to a phase-locked digital synthesiser, especially intended for use in a burst-mode communications system.

THE INVENTION

According to the invention, there is provided a phase-locked digital synthesiser comprising a voltage-controlled oscillator supplying a frequency divider the output of which is fed to a phase-sensitive detector also receiving an input from a reference oscillator, the output of the detector being fed back by a feedback loop to the voltage-controlled oscillator to achieve phase-locking, wherein the divider receives an input from a logic circuit to control the division ratio of the divider, the logic circuit being prompted by a control signal which is also used to select one of a plurality of loop filters connected for selectable use in the feedback loop from the detector to the voltage controlled oscillator, the selected loop filter being appropriate to the prompted division ratio.

Preferably, in order to ensure that the controlled division selection takes place simultaneously with the rising edges of the reference signal, a reference timing signal is fed from the reference oscillator to the logic circuit.

In a burst-mode communications system, the phase-locked digital synthesiser is used in a terminal which communicates with a similar terminal by time sharing a single frequency channel The channels transmit alternately, typically for about 1 millisecond at a frequency of 500 Hz, the transmitting terminal sending a burst of modulated carrier to the receiving terminal When one terminal is transmitting the other is receiving and vice versa. Each terminal has two loop filters alternately supplying a voltage controlled oscillator, one filter being in the loop during the transmit mode and the other filter being in the loop during the receive mode. The voltage controlled oscillator frequency therefore changes on each transition between receive mode and transmit mode. Although the voltage controlled oscillator frequency changes rapidly, there is a finite time for the frequency change to occur. This, together with the frequency pulling introduced by the transmitter power up/down, introduces a loop phase error which may amount to a few cycles at the frequency of the voltage controlled oscillator. This error arises just after each transition between receive mode and transmit mode and is then tracked out by the feedback action of the loop, but there will be a transient frequency error.

In order to compensate for this loop phase and frequency error, the phase-locked digital synthesiser preferably comprises compensating means to correct a loop phase error arising from a change in the division ratio, the compensating means comprising comparator means for comparing the phase of the output of the frequency divider with the phase of the reference signal at a sampling time after a predetermined number of reference cycles from the change in the division ratio, means for generating an incremental or decremental correction signal in dependence upon the phase comparison, and means for applying the correction signal to the frequency divider in order to adjust the division ratio, to tend to bring the output of the frequency divider into phase with the reference signal at the sampling time.

The predetermined number of cycles is preferably two, since all the loop phase error arises in the first and second cycles of the reference signal after the change in the division ratio.

In one embodiment, the correction signal is applied to the frequency divider to adjust the "new" division ratio prevailing over the first reference cycle after the change in the division ratio.

In another embodiment, which is preferred, the correction signal is applied to the frequency divider to adjust the division ratio between the beginning of the reference cycle prior to the change in division ratio and the sampling time.

The phase detector may be an edge-triggered phase detector which detects the rising edges of the pulse trains from the frequency divider and the reference oscillator.

When the synthesiser is used in a burst-mode communications system, the change in division ratio corresponds to a transition from the receive mode to the transmit mode, or vice versa.

The invention will now be described, by way of example, with reference to the accompanying drawings, in which.

Figure 2:
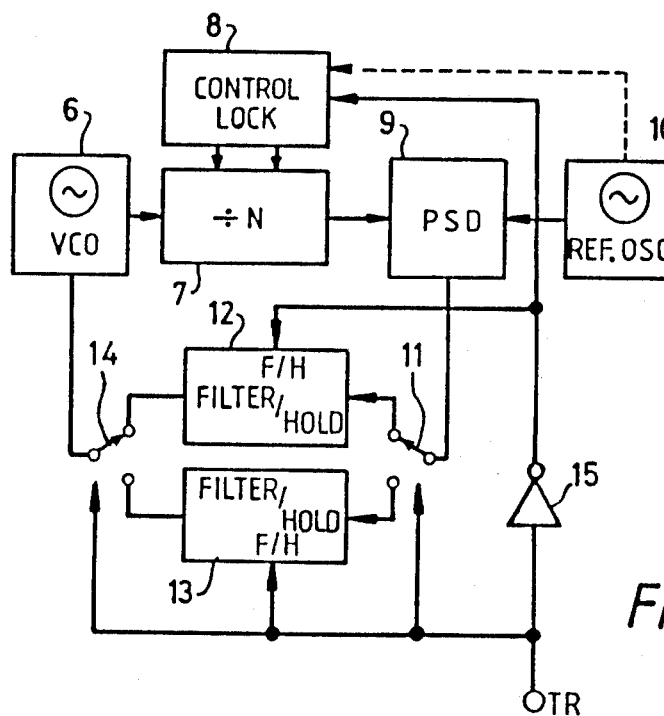
FIG. 2 shows a synthesiser in accordance with the invention.
Figure 3:
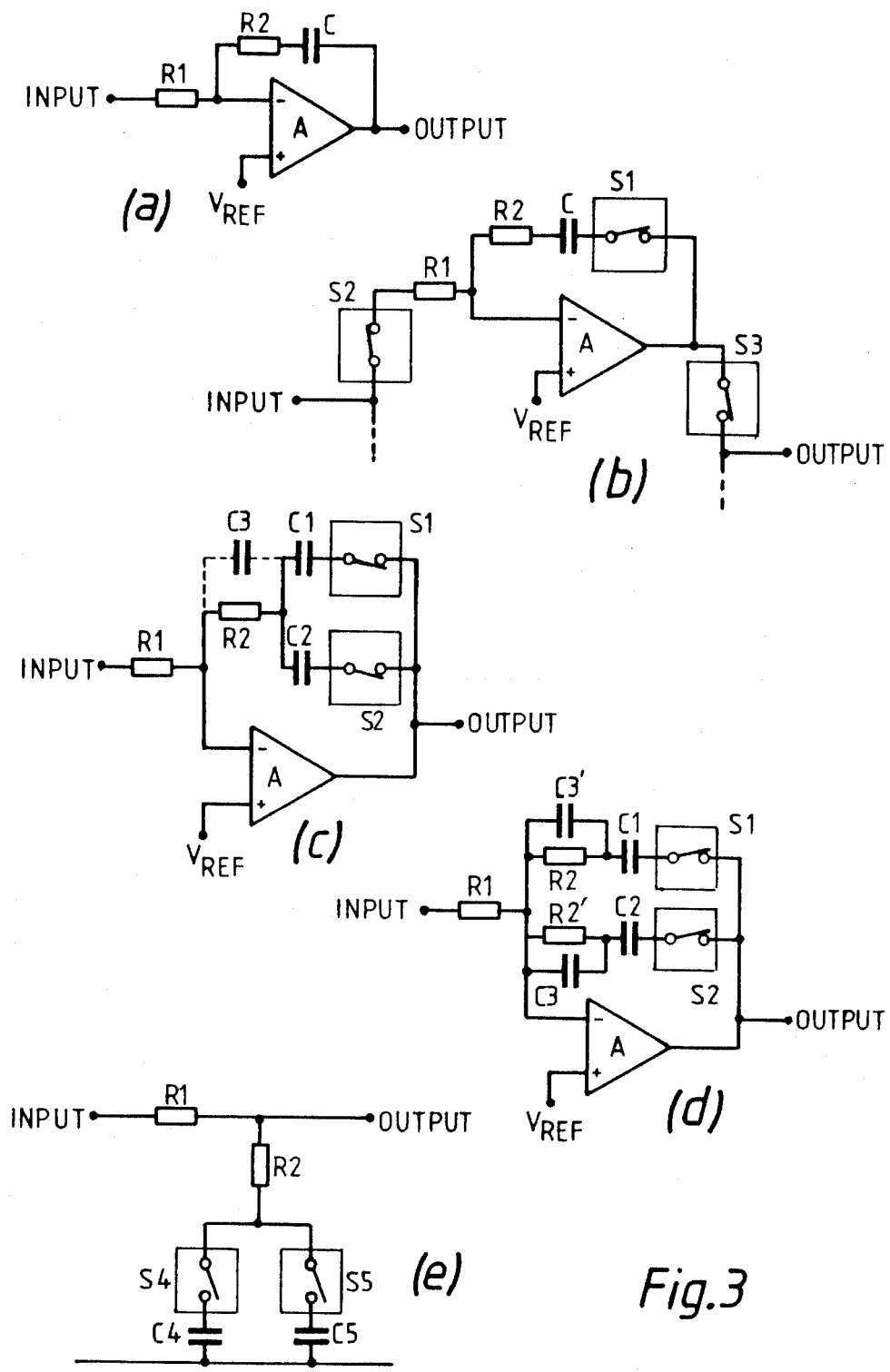
Figure 4:
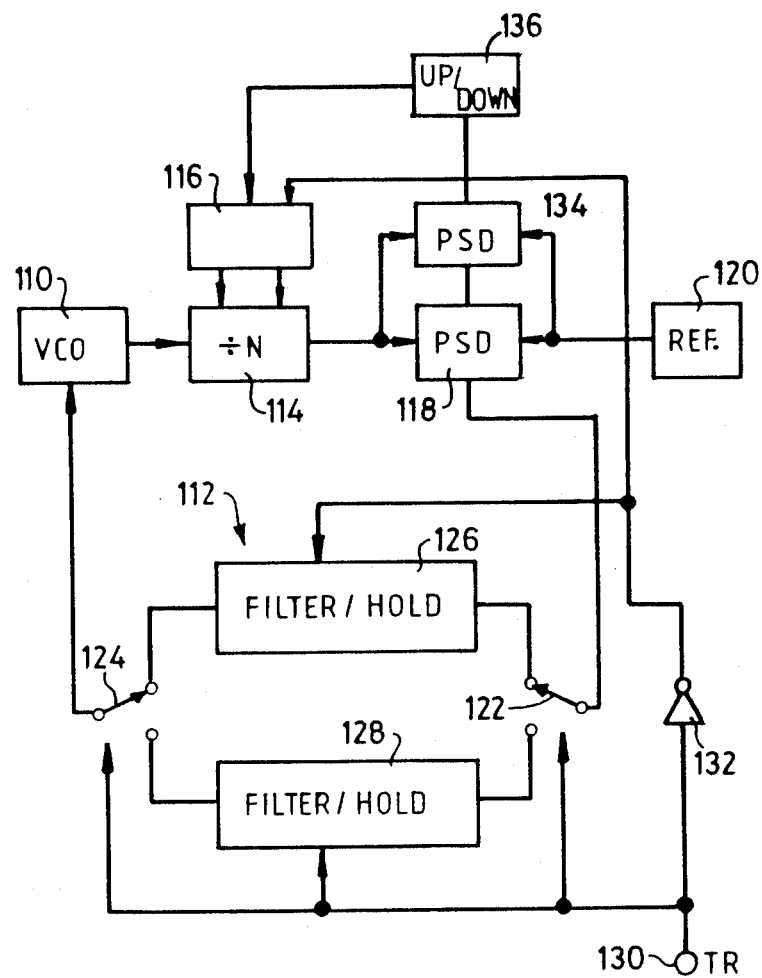
Figure 5:
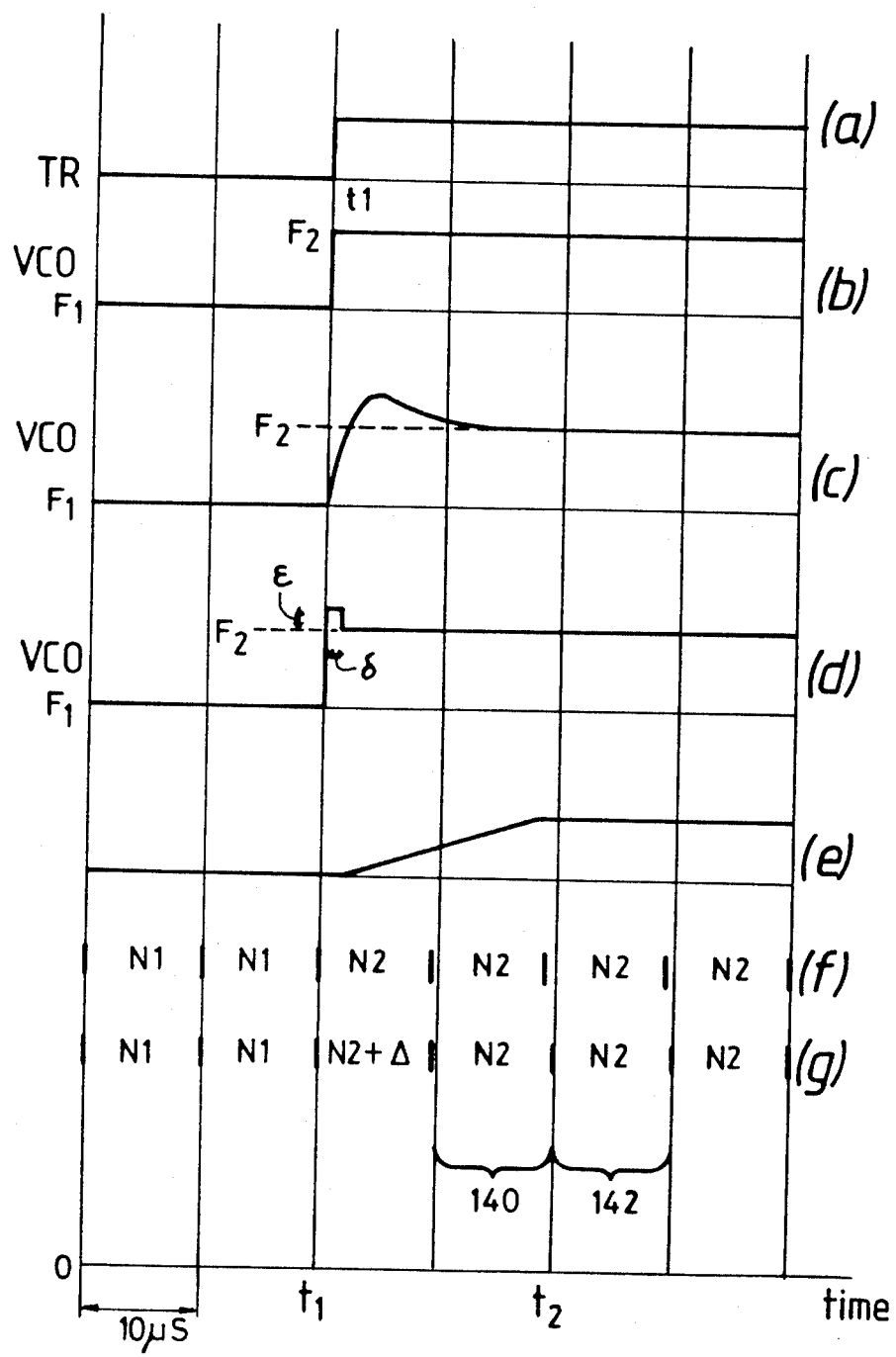
Figure 6:
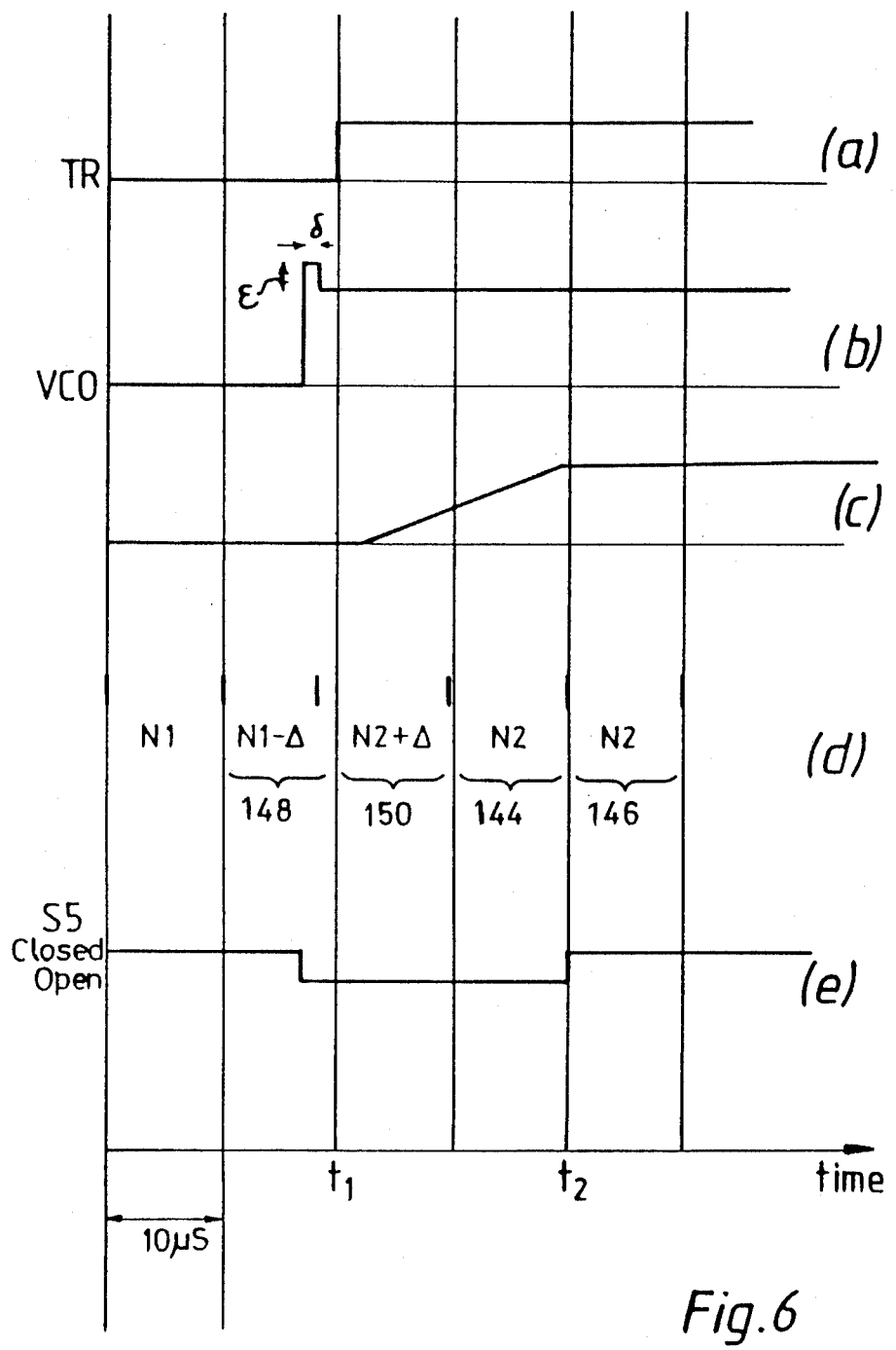
Figure 7:
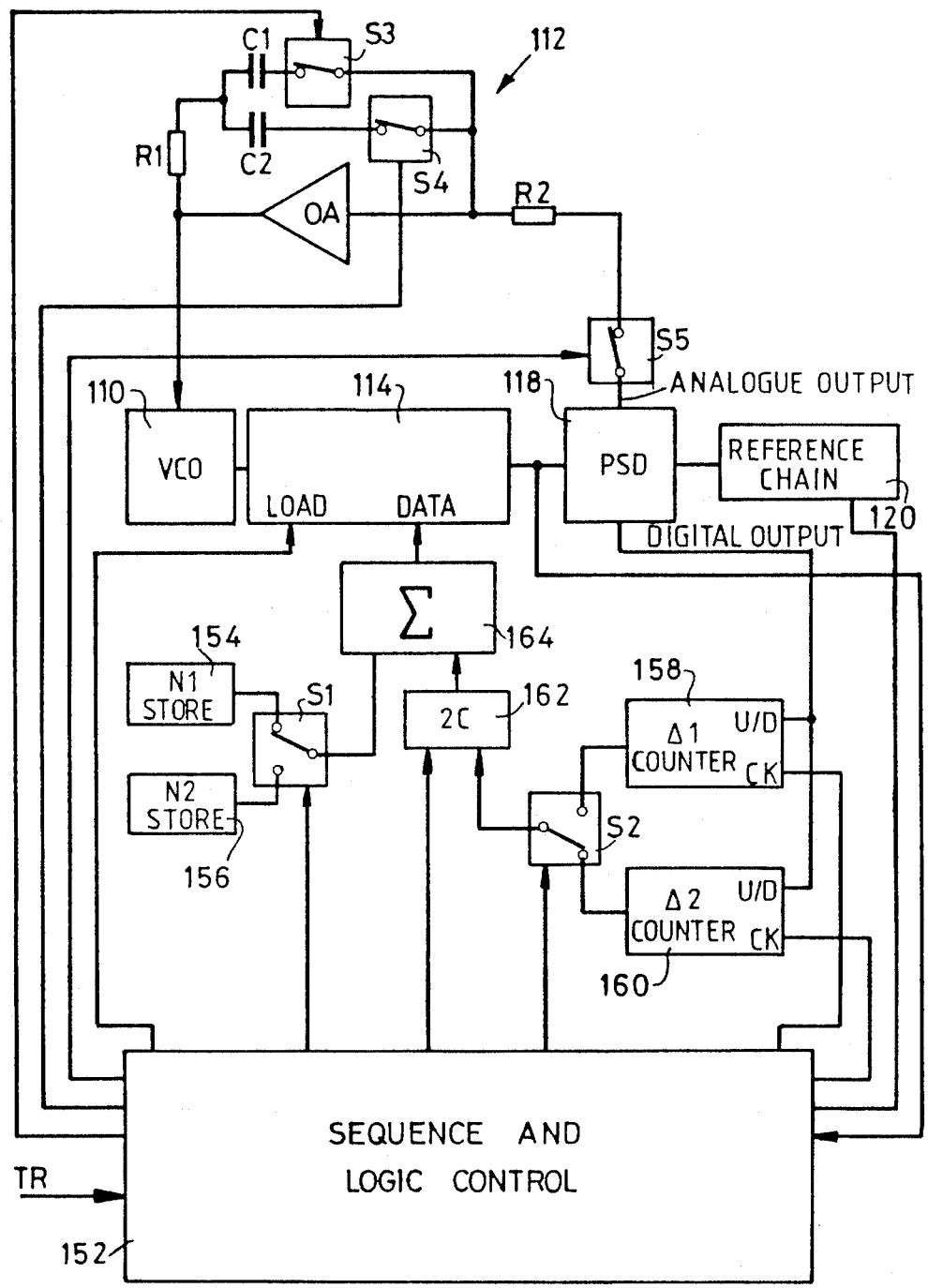

FIG. 3($a$)–($e$) shows various loop filter embodiments for use in the synthesiser of FIG. 2, FIG. 4 is a block circuit diagram of another embodiment, FIG. 5 is a timing diagram illustrating the operation of the embodiment of FIG. 4, FIG. 6 is a timing diagram illustrating the operation of a further embodiment, and FIG. 7 is a block circuit diagram of the embodiment of FIG. 6.

DETAILED DESCRIPTION OF THE DRAWINGS

Phase-locked synthesis is a well-known technique for precise frequency generation which is widely used in modern radio communication systems. A number of proposed new communication systems use so-called burst-mode duplexing, in which effectively a fully-duplex channel is achieved by time-sharing (in "half-duplex" mode) a single frequency channel. Each terminal transmits on the channel alternately, at a rate of typically 500 Hz, each sending a burst less than 1 millisecond in length of modulated carrier while the other is in receive mode. Whilst one terminal is transmitting, the other is receiving, and vice-versa; whilst each is in receive mode any data originating from its user is stored for transmission in its next transmit burst.

For such burst-mode terminals it is convenient and economical to use a common frequency source in both transmit and receive mode; however, with most radio transceiver architectures it then becomes necessary to switch the source frequency between modes. For example, it may be necessary to switch between the channel frequency in transmit and the channel frequency +/− intermediate frequency in receive.

Figure 1:
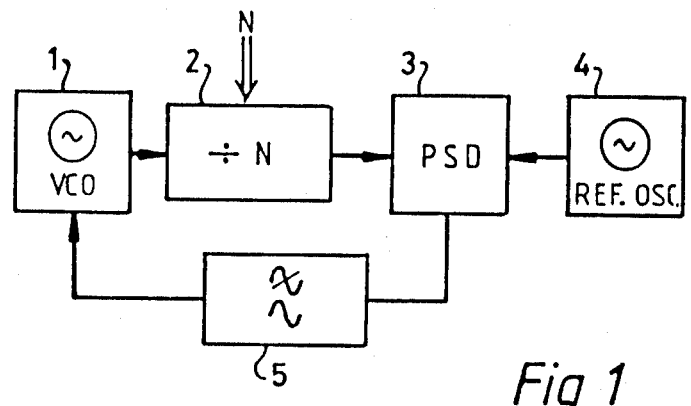
FIG. 1 shows a known synthesiser.

The architecture of a conventional phase-locked synthesiser is shown in FIG. 1. A voltage-controlled oscillator (VCO) 1, covering the desired frequency range, has its output frequency divided down by an integer N by a digital frequency divider 2, where the ratio N can be varied externally. The divider output is fed to a phase-sensitive detector (PSD) 3, as also is the output of a reference oscillator 4. The output of the phase detector is filtered by a loop filter 5, and the resulting voltage used to control the frequency of the VCO. It is well-known that the loop will lock when the two signals entering the phase detector are at the same frequency and (with appropriate choice of phase detector) in-phase. If the VCO output frequency is Fv and the reference frequency Fr, this occurs when $$\frac{Fv}{N} = Fr$$

or $$Fv = N \times Fr$$

Thus Fv can be set to precise value in integer steps of Fr by varying N

The phase-locked loop described forms a feedback control system, with its loop transfer-function determined by:

the transducer gains of the VCO and phase-sensitive detector;
the transfer-function of the loop filter 5.

In practice the selection of the loop-filter bandwidth and selectivity is determined by a trade-off between frequency-switching speed, loop stability, spurious sidebands on the generated carrier caused by reference-frequency components inadequately suppressed by the loop filter, and sensitivity to external influences such as mechanical vibration. For a typical burst-mode radio system, with a channel spacing of 100 kHz, a typical loop natural frequency would be 2–5 kHz, and a settling time for the output frequency to settle to a new value following a frequency step initiated by a change in frequency-divider ratio of several milliseconds will be experienced. Such performance is quite unsuitable for the type of burst-mode system parameters described before, with a burst length of 1 millisecond.

FIG. 2 shows a new form of the phase-locked synthesiser which overcomes this problem.

Here the VCO 6 output is divided by a frequency-divider 7 with control-logic 8 for rapidly changing the division ratio. The divider output feeds a PSD 9, as also does the reference oscillator 10. The PSD output is now switched by an analogue changeover switch 11 to one of two similar loop filters 12 and 13, which are realised as filter-and-hold circuits. The outputs of these are fed to a futher analogue changeover switch 14, where one is selected and fed to the VCO 6.

The logic signal TR is provided to the control logic 8, to the changeover switches 11 and 14, and to two filter-and-hold circuits 12, 13. The TR signal is fed through an inverter 15 to the filter-and-hold circuit 12 and to the logic 8.

When TR is *low*, one division ratio, say N1, is selected and the loop is completed via filter 13 which is in its "filter" mode. (Filter 12 meanwhile is in its "hold" mode). When TR goes *high*, division ratio N2 is selected, filter 13 is put into its "hold" mode where it stores the output voltage existing immediately preceding the TR low-to-high transition. The changeover switches 11 and 14 now select filter 12, which is put into its "filter" mode to close the loop.

It is clear that whilst TR is either "high" or "low" the loop is able to settle at either of the frequencies N1×Fr or N2×Fr; furthermore, the control voltages required to set the two VCO frequencies are continuously stored in the two filter-and-hold circuits, and thus the synthesiser can in principle settle almost immediately to the required frequency following a TR transition, and the normal channel-change settling-time of the loop is no longer a factor. For this to be strictly true, one further measure should be incorporated.

In the circuit arrangement of FIG. 2, if one filter, say 12, is selected at a given time and the system is in equilibrium, then with a common edge-triggered phase detector, the rising edges of the pulse trains from the frequency divider and reference oscillator into the PSD will be aligned in time. Suppose further that the other filter 13 has a stored voltage which will maintain the loop in equilibrium, with a different divider ratio, at a slightly higher frequency.

Suppose now that the state of the signal TR changes part way between two successive rising edges of the reference oscillator output. With a conventional variable-ratio divider, although the programmed division ratio may be changed at any time, the actual division ratio will not change until immediately after the next output pulse has been generated. Thus, because a different filter with a different stored voltage, and hence a higher frequency, has been selected between rising reference signal edges by the TR signal, the next output pulse from the variable-ratio divider will occur somewhat earlier than the reference pulse. Thus the switching operation will induce a phase error into the loop, the magnitude of which will depend on the difference between the two programmed frequencies and the time relationship between the TR transition and the reference signal rising edges. The phase error will be subsequently removed by the servo action of the loop, but in doing this a transient frequency error will be created.

It can be shown that this phase error and frequency transient can be avoided by ensuring that the TR signal changes synchronously with the rising edges of the reference signal, and the dashed link in FIG. 2 between the reference oscillator 10 and the control logic 8 indicates that reference timing information is required by the control logic for this purpose. In the context of a burst-mode communication system as referred to earlier, this implies that the burst length should be an integral number of reference frequency periods.

A number of different configurations are possible for the filter-and-hold circuits. Some of these are shown in FIG. 3.

FIG. 3(a) shows for illustration a conventional active lag-head filter as widely used in synthesiser design. R1, C and A form a conventional operational-amplifier integrator at low frequencies, whilst the resistor R2 introduces a compensating phase-lead at higher frequencies to improve loop stability margin.

In FIG. 3(b) switch S1 has been introduced to isolate capacitor C when in "hold" mode. Such a circuit could form one of the filters 12 or 13 in FIG. 2. Switches S2 and S3 in FIG. 3(b) each form one half of the single-pole changeover switches 14 and 11 in FIG. 2.

In all these configurations the logic-controlled analogue switches may be implemented very conveniently as CMOS bilateral switches.

FIG. 3(c) shows a simpler configuration in which two capacitors C1 and C2 are included in the operational amplifier feedback path, together with their associated switching elements S1, S2. By this means the separate changeover switches may be eliminated. Also shown is a capacitor C3, with a dotted connection line, which may be included to introduce a high-frequency roll-off into the open-loop response to reduce reference-frequency noise feedthrough. However, the inclusion of this capacitor may introduce frequency transients just after a switching operation if there is any voltage across C3 just before. FIG. 3(d) shows an alternative form incorporating two series resistors R1, R2 or R1, R2' with accompanying capacitors, so that each feedback network is fully isolated when its series switch S1 or S2 is operated.

FIG. 3(e) shows a passive form of the lag-lead circuit, incorporating two reservoir capacitors C4, C5 with series switches S4, S5.

In some radio systems, such as half-duplex telemetry transceivers, a fast-switching synthesiser is also required, but the time spent at either frequency may be much longer than in the above schemes, typically from several seconds to several minutes. In such cases a simple capacitor will not in practice hold the voltage because of leakage currents, and an alternative arrangement is to digitise the voltage when in "filter" mode and store it digitally in "hold", restoring it to an analogue form when required through a digital analogue converter. By careful design, the digital to analogue converter may also be used in digitising the analogue value, thus reducing errors between the digitising and analogue restoration processes.

FIG. 4 shows the block circuit diagram of a phase-locked digital synthesiser according to the invention and intended for use in a burst-mode communications system. A voltage controlled oscillator (VCO) 110 receives its input from a feedback loop 112. The VCO output is connected to a digital divider 114 which divides the frequency of the VCO output by an integer N. The integer represents the division ratio and can be varied by a control logic circuit 116. The output of the divider 114 is fed to a phase sensitive detector 118, to which is also fed the output of a reference oscillator 120 having a reference frequency f0. The phase sensitive detector 118 is connected by change-over switches 122, 124 through one or other of two filter and hold circuits 126, 128 to the input of the voltage control oscillator 110.

A TR logic signal at a point 130 is low when the terminal is in the receive mode and high when the terminal is in the transmit mode. The terminal remains in each mode for 1 millisecond before switching modes. Whilst the terminal is in receive mode any data originating from its user is stored for transmission in the next transmit burst. The TR logic signal is fed via an inverter 132 to the circuit 126 and to the control logic circuit 116, and directly to the switches 122, 124 and the circuit 128.

When the TR signal is low, the control logic circuit 116 selects one division ratio N1 and the feedback loop is completed through the filter and hold circuit 126. When the TR signal is high, division ratio N2 is selected, the filter 126 is put into a hold condition where it stores the output voltage existing immediately prior to the transition, and the filter and hold circuit 128 is brought into the feedback loop in place of the filter and hold circuit 126. The switching of the circuits 126, 128 is carried out by the switches 122, 124.

The phase detector 118 is edge-triggered, ie it is sensitive to the rising edges of the pulse trains from the divider 114 and the reference oscillator 120. The TR signal changes synchronously with the rising edges of the reference signal from the oscillator 120, the oscillator 120 and the control logic circuit 116 being linked for this purpose. Hence, the burst length (ie the length of time for which the terminal is transmitting or receiving) must be an integral number of cycles of the reference frequency f0 from the reference oscillator 120.

In the preferred embodiment, the reference oscillator 120 has a frequency of 100 kHz, the VCO frequency F1 during receive mode is 800 MHz and the VCO frequency F2 during transmit mode is 810 MHz. N1 is then 8000 and N2 8100. The division ratio N1 or N2 is set by a register feeding a counter. The required division ratio N1 or N2 is fed into the register by the control logic circuit 116, then the division ratio N1 or N2 is supplied to the counter each time this has decremented to zero. Hence, during the receive mode, at the commencement of a cycle of the reference frequency f0, the division ratio 8000 will be loaded from the register into the counter. The counter will then decrement to zero at which point a rising pulse edge will be detected by the phase sensitive detector 118. When the counter reaches zero a fresh division ratio N1 (or N2 if the terminal is about to go into transmit mode) will be loaded from the register into the counter.

FIG. 5a shows a representative transition at time t1 of the logic signal TR from its receive mode to its transmit mode. The vertical lines in FIG. 5 represent edges of the reference frequency f0, the temporal spacing of these lines therefore being 10 microseconds because f0 is 100 KHz.

FIG. 5b shows how the VCO frequency theoretically changes instantaneously from F1 to F2 where:

$$F1 = N1 \times f0 \text{ and}$$

$$F2 = N2 \times f0$$

FIG. 5c shows the actual profile of the VCO frequency change, indicating that it takes a finite time for the frequency to change from F1 to F2 and that there is thereafter an overshoot, the frequency settling back to F2 during the second reference cycle after time t1.

For analytical convenience the change in VCO frequency is idealised as a rectangular overshoot of maximum frequency error $\epsilon$ Hz and length $\delta$ seconds, as shown in FIG. 5d.

FIG. 5e shows the transmitter power transient, illustrating that the new value is achieved after two cycles of the reference frequency.

Because the VCO frequency does not change instantaneously at time t1 (FIG. 5c), and because of the transmitter power up/down variation (FIG. 5e) a phase loop error is introduced. This manifests itself in the VCO edge signals after division from the divider 114 being as illustrated in FIG. 5f. It will be noted that initially the divided VCO edge signals are synchronous with the reference edges but that during the next few reference cycles the VCO edge signals are out of phase with the reference edge signals. FIG. 5f also shows the division ratio N1 or N2 which prevails during each reference cycle. It will be appreciated that if the error on transition results in the overshoot being positive as illustrated in FIG. 5d there will be too many pulses and the counter will, during the first refernce cycle after time t1 count down from 8100 and will then reach zero before the corresponding reference edge. Conversely, if the rectangular overshoot is negative there will be insufficient pulses, the counter will reach zero late and the divided VCO edge pulses will occur just after the reference edges, rather than before as illustrated in FIG. 5f.

FIG. 5g illustrates how compensation is achieved. After two reference cycles from the transition time t1 the phases of the two inputs to the phase sensitive detector 118 are compared at a sampling time t2. This phase comparison is achieved by the phase sensitive detector 134 shown in FIG. 4. The detector 134 feeds an up-/down counter 136 the output of which is fed to the control logic circuit 116 to vary the divider ratio. If the phase error detected by the phase sensitive detector 134 is in the cycle 140 immediately prior to time t2 a correction signal in the form of a division ratio offset $\Delta$ is incremented by 1. If the phase error is in the cycle 142 immediately succeeding time t2, $\Delta$ is decremented by 1. The counter offset $\Delta$ is added to the division ratio N2 for the first reference period of the burst only, ie for the first reference cycle following the transition at time t1. Hence, at time t1 the counter is loaded with N2+$\Delta$ and this has the effect of bringing the divided VCO edges back into synchronism with the reference edges at time t2 and thereafter during that burst. It will be appreciated that $\Delta$ is stored from transition to transition and that, after adjustment at time t2, the adjusted and updated $\Delta$ is added to N2 at the start of the first reference cycle following the next transmit/receive transition.

The value of $\Delta$ is computed by the first order digital control loop, including the detector 134 and counter 136, as illustrated in FIG. 4. The adjustment or offset $\Delta$ is incremented or decremented according to the phase error at the sampling time t2 which occurs at the second reference edge after each transition. When the digital control loop controlling the $\Delta$ adjustment is in equilibrium, the residual phase error will be within + or −1 VCO cycle.

The performance of the compensation scheme illustrated in FIG. 5 may not be acceptable for all applications. The alternative compensation scheme illustrated in FIG. 6 offers greater discrimination. FIG. 6a again shows the change in the TR logic signal at a transition from receive mode to transmit mode. The vertical lines in FIG. 6 represent reference edges, as previously described for FIG. 5.

FIG. 6b shows the theoretical VCO frequency with an overshoot $\epsilon$ lasting for a time $\delta$. FIG. 6c shows the transmitter power transient which occurs shortly after each receive/transmit transition. The two inputs to the phase sensitive detector 118 are again sampled at time t2, corresponding to the second reference edge after the transition. A division ratio offset $\Delta$ is decremented by 1 if the phase error ocurs in the cycle 144 and the offset $\Delta$ is incremented by 1 if the phase error occurs in the cycle 146. However, in FIG. 6 the $\Delta$ offset is introduced twice: once to set the divider 114 to N1−$\Delta$ during the last reference cycle 148 of the receive burst: and a second time to set the divider 114 to N2+$\Delta$ during the first VCO counter cycle 150 of the transmit burst. A further difference that FIG. 6 possesses over that of FIG. 5 is that the selection of the alternative loop filter capacitor, and hence the frequency transition, is timed off the VCO edge rather than the reference edge.

The system of FIG. 6 is analysed by counting the number of VCO cycles entering the divider 114 prior to the first reference edge after R/T transition at time t1. The contents of the counter at the reference edge is given by:

$$N2 + \Delta - (N2 \times f0 + \epsilon)\delta -$$

$$N2 \times f0(1/f0 + \Delta/N1 \times f0 - \delta) = \Delta -$$

$$\epsilon\delta - N2 \times \Delta/N1 = \Delta(1 - N2/N1) - \epsilon\delta$$

Now $\epsilon\delta$ is the phase error (in cycles) as before, so that for zero phase error we get $$\Delta(1 - N1/N2) = \epsilon\delta$$

But $$N2 = N1 + NI$$

where N1 is the i.f. offset (expressed as a multiple of the reference frequency). Thus $$\Delta(1 - (N1 + NI)/N1) = \epsilon\delta$$

giving $$\Delta = -\epsilon\delta \times N1/NI$$

In the present case, f0=100 kHz, N=8550 (mean), NI=100 (approx. for 10.7 MHz i.f.) so that $$\Delta = -85.5 \epsilon\delta$$

where of course the nearest integer value of $\Delta$ must be taken.

Now, for a phase error of about 1 cycle we see that $\Delta$ needs to be of the order of 85. Furthermore the phase adjustment caused by a unit increment of $\Delta$ is approx. 1/85 cycles or 4.2 degrees. The phase error, and hence peak frequency transient, will therefore be 85 times less than in the embodiment of FIG. 5.

The value of $\Delta$ is calculated, as indicated, by a first-order digital loop as before, which increments or decrements the counter 136 according to the phase error at the second reference edge following the R/T transition.

A similar compensation is needed on each receive-transmit frequency transition, requiring a second stored value of $\Delta$ to be interleaved with the first.

FIG. 7 shows the block circuit diagram of a synthesiser for achieving the compensation illustrated diagrammatically in FIG. 6. Parts in FIG. 7 similar to those in FIG. 4 bear the same reference numerals. In FIG. 7, the feedback loop 112 has two capacitors C1 and C2 which are selectively and alternately connected in the feedback loop by switches S3 and S4 connected to a sequence and control logic 152 to which the TR signal is applied. As before, the signal from the feedback loop 112 is applied to the VCO 110 which is connected to the divider 114. A switch S1 selects division ratio N1 or N2, the numbers N1 and N2 being in respective stores 154, 156. A switch S2 selects $\Delta 1$ or $\Delta 2$ (or neither) from respective counters 158, 160.

A two's complementer 162 allows $\Delta 1$ or $\Delta 2$ to be added to or subtracted from the numbers N1 or N2. A digital summer 164 feeds the selected division ratio, with any correction $\Delta 1$ or $\Delta 2$, to the divider 114.

The phase sensitive detector 118 has its analogue output fed through a switch S5 to the feedback loop 112. The switch S5 allows the output of the detector 118 to be disconnected from the loop 112 for a short period whilst the divider ratio is being changed, as shown in FIG. 6e.

I claim:

1. A phase-locked digital synthesizer comprising a voltage-controlled oscillator, a frequency divider supplied by the oscillator, a phase-sensitive detector to which is fed the output of the divider, the detector also receiving an input from a reference oscillator, the output of the detector being fed back by a feedback loop to the voltage-controlled oscillator to achieve phase-locking, wherein the divider receives an input from a logic circuit to control the division ratio of the divider, the logic circuit being prompted by a control signal which is also used to select one of a plurality of loop filters connected for selectable use in the feedback loop from the detector to the voltage controlled oscillator, the selected loop filter being appropriate to the prompted division ratio, wherein compensating means are provided to correct a loop phase error arising from a change in the division ratio, the compensating means comprising comparator means for comparing the phase of the output of the frequency divider with the phase of the reference signal at a sampling time after a predetermined number of reference cycles from the change in the division ratio, means for generating an incremental or decremental correction signal in dependence upon the phase comparison, and means for applying the correction signal to the frequency divider in order to adjust the division ratio, to tend to bring the output of the frequency divider into phase with the reference signal at the sampling time.

2. A synthesiser according to claim 1, wherein a reference timing signal is fed from the reference oscillator to the logic circuit, to ensure that the controlled division selection takes place simultaneously with the rising edges of the reference signal.

3. A synthesiser according to claim 1, wherein the predetermined number of cycles is two.

4. A synthesiser according to claim 1, wherein the correction signal is applied to the frequency divider to adjust the division ratio prevailing over the first reference cycle after the next change in the division ratio.

5. A synthesiser according to claim 1, wherein the correction signal is applied to the frequency divider to adjust the division ratio between the beginning of the reference cycle prior to the next change in division ratio and the sampling time.

6. A synthesiser according to claim 1, wherein the phase detector is an edge-triggered phase detector which detects the rising edges of the pulse trains from the frequency divider and the reference oscillator.

7. A synthesiser according to claim 1, and used in a burst-mode communications system,, the change in division ratio corresponding to a transition from the receive mode to the transmit mode, or vice versa.

8. A synthesiser according to claim 7, wherein two correction signals are derived, stored and updated, the first correction signal correcting the loop phase error arising from a change in division ratio occurring upon a transition from a receive mode to a transmit mode, and the second correction signal correcting the loop phase error arising from a change in division ratio occurring upon a transition from a transmit mode to a receive mode.

* * * * *